United States Patent [19]
Liou et al.

[11] Patent Number: 5,847,465
[45] Date of Patent: Dec. 8, 1998

[54] CONTACTS FOR SEMICONDUCTOR DEVICES

[75] Inventors: Fu-Tai Liou, Carrollton; Yu-Pin Han, Dallas, both of Tex.

[73] Assignee: STMicroelectronics, Inc., Carrollton, Tex.

[21] Appl. No.: 436,165

[22] Filed: May 8, 1995

Related U.S. Application Data

[62] Division of Ser. No. 210,071, Mar. 17, 1994, which is a continuation of Ser. No. 970,648, Nov. 2, 1992, abandoned, which is a continuation of Ser. No. 324,586, Mar. 16, 1989, abandoned.

[51] Int. Cl.⁶ .......................... H01L 23/48; H01L 23/52; H01L 29/40; H01L 27/088
[52] U.S. Cl. .......................... 257/774; 257/900; 257/382; 257/377
[58] Field of Search .................................. 257/774, 900, 257/731, 752, 754, 757, 763, 764, 770, 382, 377

[56] References Cited

U.S. PATENT DOCUMENTS

| | | | |
|---|---|---|---|
| 3,825,442 | 7/1974 | Moore | 437/982 |
| 4,284,659 | 8/1981 | Jaccodine | 437/982 |
| 4,443,493 | 4/1984 | Delfino | 437/982 |
| 4,455,325 | 6/1984 | Razouk | 437/164 |
| 4,489,481 | 12/1984 | Jones | 437/982 |
| 4,641,420 | 2/1987 | Lee | 148/619 |
| 4,755,479 | 7/1988 | Miura | 437/44 |
| 4,786,609 | 11/1988 | Chen | 437/30 |
| 4,795,718 | 1/1989 | Beitman | 437/41 |
| 4,808,548 | 2/1989 | Thomas et al. | 437/44 |
| 4,810,666 | 3/1989 | Taji | 437/30 |
| 4,905,064 | 2/1990 | Yabu et al. | 257/900 |
| 5,414,302 | 5/1995 | Shin et al. | 257/752 |

FOREIGN PATENT DOCUMENTS

| | | | |
|---|---|---|---|
| B-36307/84 | 6/1985 | Australia . | |
| 59-84442 | 5/1984 | Japan . | |
| 5-315623 | 11/1993 | Japan | 257/382 |

OTHER PUBLICATIONS

Sakamoto, M. et al., "A New Self . . . ," IEEE IEDM Tech. Digest, 1980, pp. 136–139.
Lau, C.K. et al., "A Super Self . . . ," IEEE IEDM Tech. Digest, 1987, pp. 358–361.
Anner, G., Planar Processing Primer, Van Nostrand Reinhold, 1990, pp. 148–178.
Wolf, S. et al., Silicon Processing for the VLSI Era, vol. 1, Lattice Press, 1986, pp. 187–191.
Wolf, S. et al., Silicon Processing, vol. 1, 1986, Lattice Press, pp. 370–373, 384–387.

*Primary Examiner*—Mahshid D. Saadat
*Assistant Examiner*—Jhihan B. Clark
*Attorney, Agent, or Firm*—Theodore E. Galanthay; Kenneth C. Hill; Lisa K. Jorgenson

[57] ABSTRACT

A method for fabrication of metal to semiconductor contacts results in sloped sidewalls in contact regions. An oxide layer is deposited and etched back to form sidewall spacers. A glass layer is then deposited and heated to reflow. After reflow, an etch back of the glass layer results is sloped sidewalls at contact openings and over steps.

10 Claims, 3 Drawing Sheets

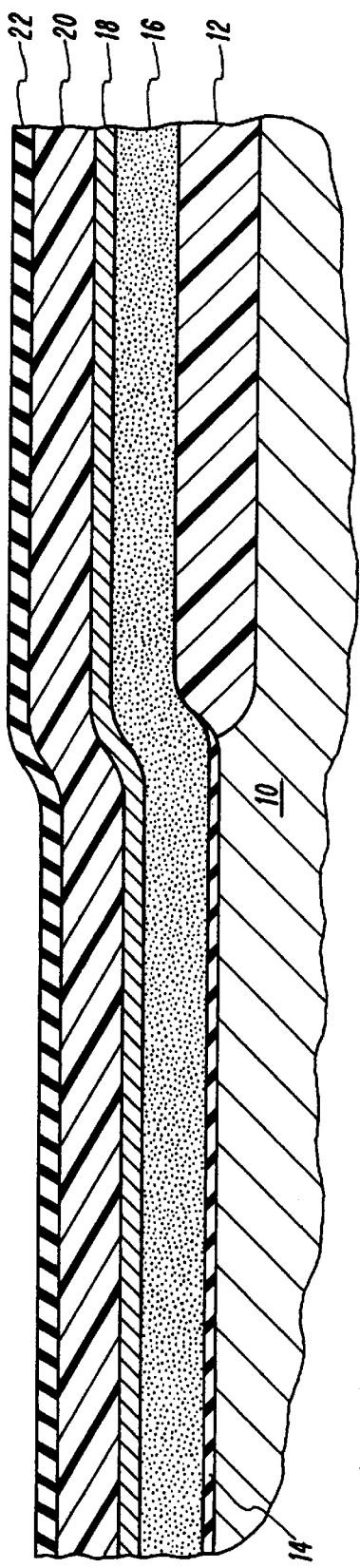
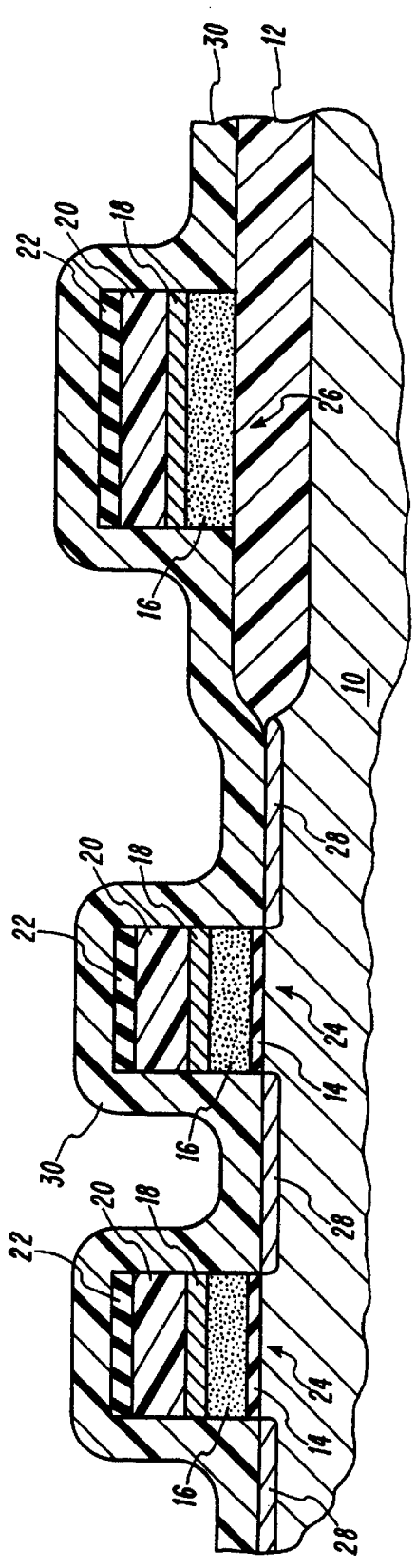
FIG. 1
FIG. 2

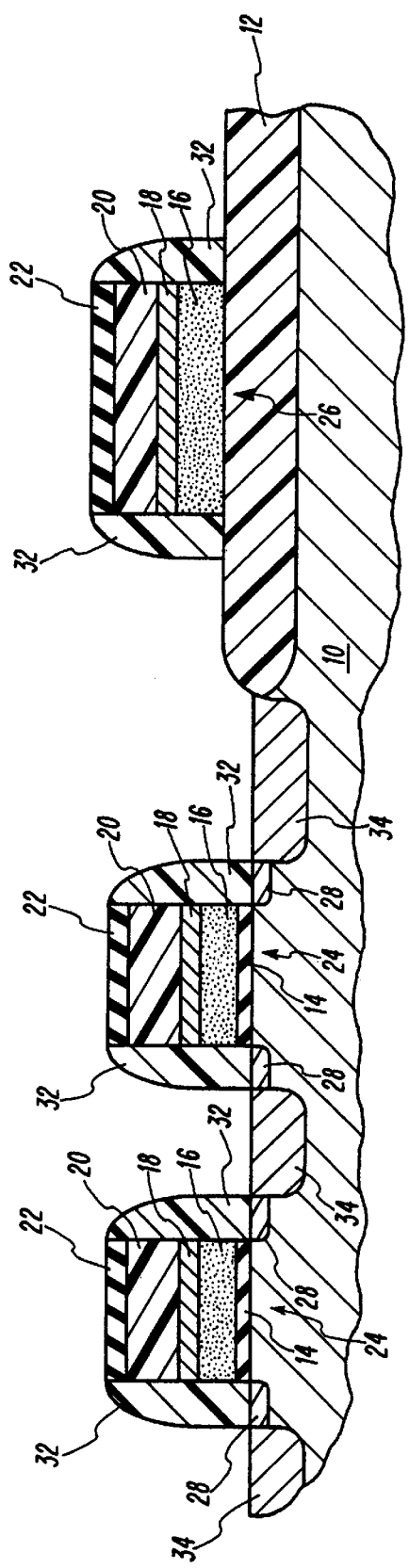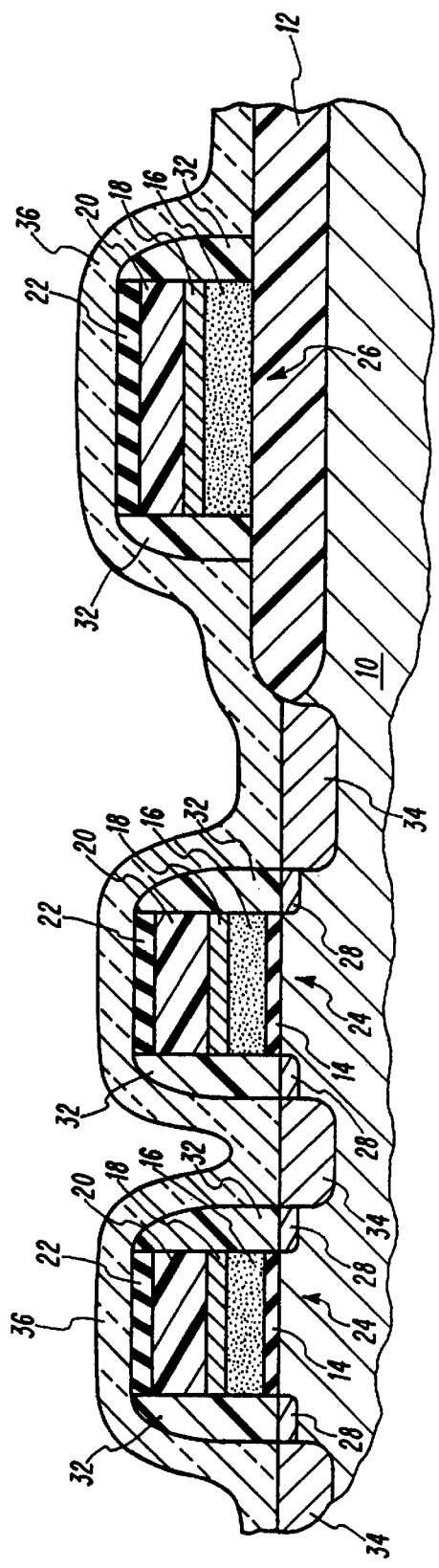

CONTACTS FOR SEMICONDUCTOR DEVICES

This is a Division of application Ser. No. 08/210,071, filed Mar. 17,1994, which is a continuation of application Ser. No. 07/970,648, filed Nov. 2,1992, now abandoned, which is a continuation of application Ser. No. 07/324,586, filed Mar. 16,1989, now abandoned.

BACKGROUND OF THE INVENTION

1. Field of the Invention

The present invention relates generally to semiconductor integrated circuit processing, and more specifically to improving step coverages for metal signal lines at contacts and other locations.

2. Description of the Prior Art

As integrated circuits are designed using increasingly smaller design rules, it is important that metal to active area contacts are also made smaller in order to reduce overall layout area. Because of spacing considerations at smaller geometries, some type of self-alignment process for fabricating contact openings is usually required.

Examples of previous techniques used to fabricate self-aligned contacts are described in A NEW SELF-ALIGNED CONTACT TECHNOLOGY, Sakamoto and Hamano, 1980 IEDM proceedings, pages 136–139; and A SUPER SELF-ALIGNED SOURCE/DRAIN MOSFET, C. K. Lau et al, 1987 IEDM proceedings, pages 158–361.

The Sakamoto reference shows the use of polysilicon regions disposed over active area contacts, with smaller contact openings in a glass layer through which the metal makes contact with such polysilicon regions. The Lau reference shows the use of selective silicon growth epitaxy to form enlarged areas which make contact with tungsten plugs. The tungsten plugs are fabricated in relatively small contact openings through a BPSG glass layer.

Steep sided contact cuts, especially in contact openings having a small cross-sectional area, can lead to the formation of voids within the contact opening, and incomplete contact coverage. This degrades the electrical characteristics of the metal to silicon contact.

A related problem is metal step coverage over polysilicon signal lines. The metal traces tend to be thinner at the edges of such steps, leading to electromigration problems, especially in the smaller geometries.

It would be desirable for a semiconductor fabrication process to provide self-aligned contacts suitable for use with small geometries. It would further be desirable for such a fabrication technique to minimize metal coverage problems in contacts and over steps having steeply sloped sides.

SUMMARY OF THE INVENTION

It is therefore an object of the present invention to provide a semiconductor fabrication technique for making self-aligned contacts which is suitable for use with small geometries.

It is a further object of the present invention to provide such a semiconductor fabrication process which provides sloped sides on contact openings.

It is another object of the present invention to provide such a semiconductor fabrication process which provides sloped sidewalls for steps across underlying polysilicon signal lines.

It is yet another object of the present invention to provide such a semiconductor fabrication process which is easily adapted for use with standard integrated circuit fabrication process flows.

Therefore, according to the present invention, after patterning of a polycrystalline silicon layer, sidewall oxide spacers are formed. An insulating glass layer is formed over the surface of the integrated circuit, and reflow of such glass layer is performed. When the glass insulating layer is etched back using an anisotropic etch, glass filler regions are left along the sidewalls of contact openings and along steps. These filler regions cause the insulator profile over steps and in contact openings to be less steeply sloped, providing better metal coverage in these regions.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1–6 illustrate a preferred process flow according to the present invention.

DESCRIPTION OF THE PREFERRED EMBODIMENT

Figure 5:
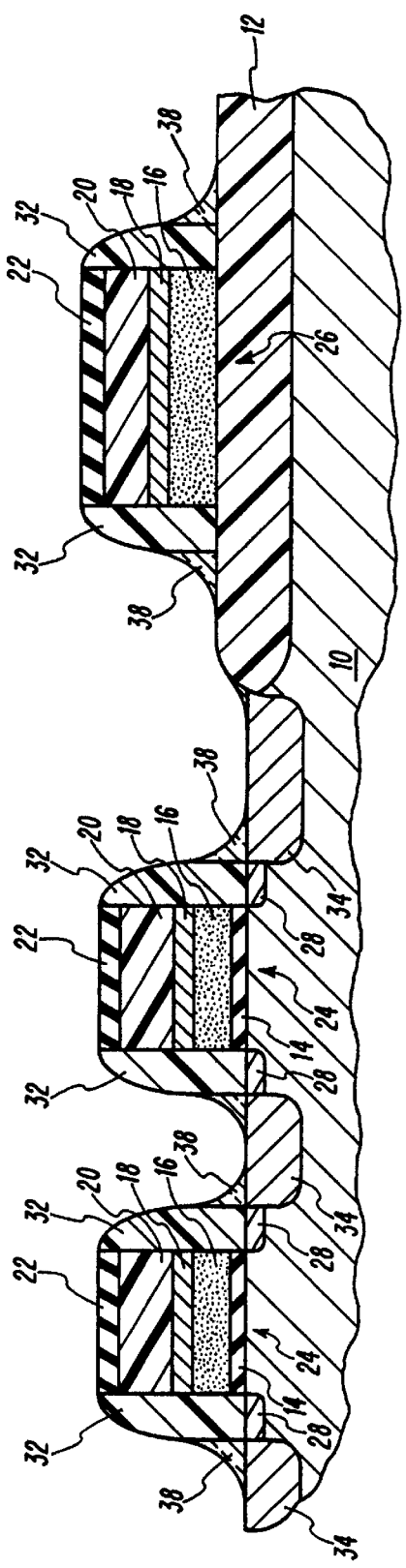

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. FIGS. 1–6 represent a cross-section of a portion of an integrated circuit during fabrication. The figures are not drawn to scale, but instead are drawn so as to illustrate the important features of the invention.

Referring to FIG. 1, an integrated circuit is to be formed in a substrate 10. Selected regions of the substrate 10 are oxidized to form a field oxide 12 as known in the art. Active devices are formed in those portions of the substrate 10 not covered by field oxide 12.

After the active areas have been defined and doped as known in the art, a gate oxide layer 14 is grown over the active regions. A layer of polycrystalline silicon 16 is then deposited over the entire surface of the chip. This layer 16 will be patterned to form device gates and interconnect lines. A silicide layer 18, such as tantalum disilicide ($TaSi_2$) or titanium disilicide ($TiSi_2$) is preferably formed over the polycrystalline silicon layer 18 in order to decrease resistivity.

A layer of oxide 20 is deposited using chemical vapor deposition (CVD), followed by formation of a nitride layer 22 ($Si_3N_4$), which is also preferably formed using a CVD process.

Referring to FIG. 2, the integrated circuit is then patterned and etched using known techniques in order to form transistor device gates 24 and interconnect regions 26. Each transistor gate region 24 consists of a gate oxide-polysilicon/silicide-oxide-nitride stack. Interconnect regions 26 are similar, without the gate oxide layers 14.

After gate patterning, lightly doped regions 28 are created by ion implant. These regions 28 are used to form lightly doped drain (LDD) structures as known in the art. After LDD implant and anneal, an undoped low temperature oxide (LTO) layer 30 is deposited over the entire chip using CVD.

Referring to FIG. 3, the LTO layer 30 is etched back using an anisotropic plasma etch, resulting in sidewall spacers 32 alongside gates 24 and interconnect 26 as known in the art. Heavily doped source/drain regions 34 are then formed by ion implantation and anneal as known in the art.

Referring to FIG. 4, a layer 36 of phospho-silicate glass (PSG) or boro-phospho-silicate glass (BPSG) is formed over the integrated circuit. When formed using CVD, the BPSG layer 36 substantially conforms with the topography of underlying device. After deposition, the BPSG layer 36 is heated to reflow, smoothing out the surface thereof.

Referring to FIG. 5, the BPSG layer 36 is etched back using an anisotropic plasma etch, resulting in the formation of filler regions 38 alongside steep sidewalls such as those formed by sidewall spacers 32. The nitride layer 22 acts as an etch stop for the BPSG layer 36 in order to protect gates 24 and interconnect regions 26.

Reflow of the BPSG layer 36 prior to etch back causes the filler regions 38 to have a relatively gently sloped cross-section. If the BPSG layer 36 is etched back without reflow, the filler regions 38 tend to have a steeper cross-section similar to that of the sidewall spacers 32.

Figure 6:
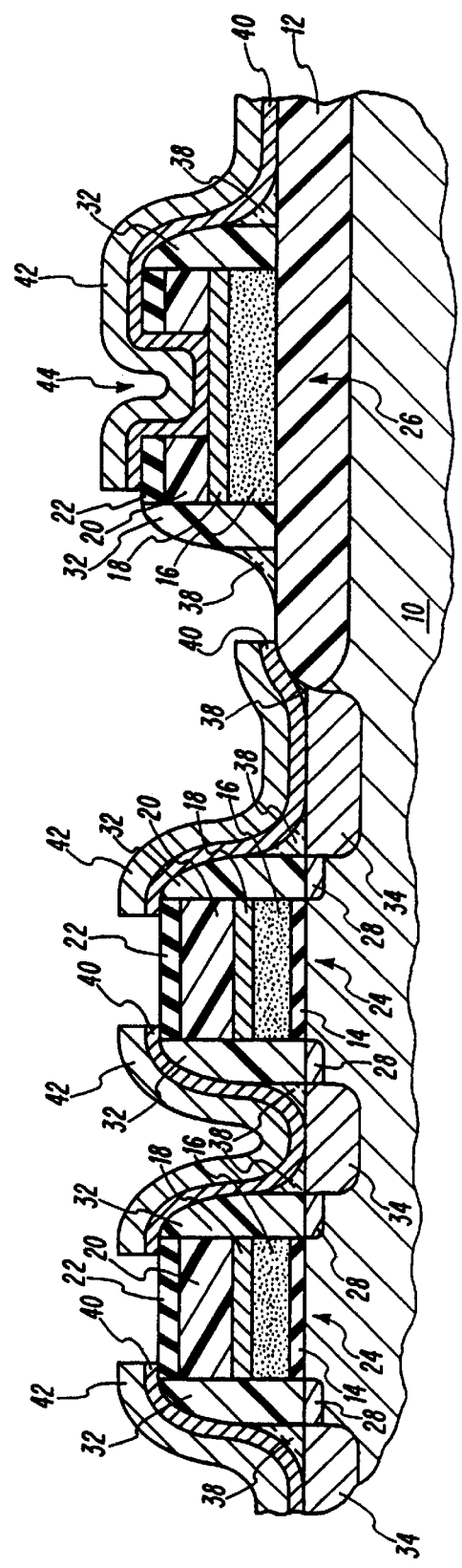

Referring to FIG. 6, a layer of barrier metal 40, such as titanium-tungsten (TiW) is deposited over the surface of the chip if desired, followed by a layer 42 of a metal such as aluminum. The metal layer 42 makes contact with the source/drain regions 34 through the barrier metal layer 40. If it is desired for the metal interconnect layer to contact a polysilicon interconnect region 26, an interconnect contact region 44 can be defined prior to the deposition of metal layers 40 and 42. Aluminum interconnect layer 42 is then patterned and passivated as known in the art, followed by deposition and patterning of additional metal layers if desired.

As can be seen from FIG. 6, the filler regions 38 smooth the profile of contacts to the source/drain regions 34, and the steps over interconnect regions 26. These fillers 38 change the cross-sectional profile of steps from nearly vertical to a more gently sloped profile. This allows the metal to be deposited with a greatly decreased chance of void formation or incomplete contact formation.

Deposition and patterning of the various layers may be varied to be made consistent with process flows for the devices being fabricated. In a typical embodiment, the gate oxide layer 14 will be grown to a depth of approximately 400 to 800 angstroms. The polycrystalline silicon layer 16 will typically be approximately 1,500 angstroms thick, and the silicide layer 18, if used, is typically from 1,000 to 1,500 angstroms thick. The oxide layer 20 is preferably from 2,000 to 6,000 angstroms thick, while the nitride layer 22 has a thickness of approximately 500 to 1,000 angstroms. The LTO oxide layer 30 used to form the sidewall spacers 32 preferably has a depth of approximately 1,500 angstroms prior to etch back. The BPSG layer 36 is preferably deposited to a depth of approximately 5,000 angstroms prior to reflow. Of course, after reflow the thickness will vary somewhat according to the underlying topographical features.

As will be appreciated by those skilled in the art, the process steps described above can be used with nearly any conventional process flow. For example, the described process steps are compatible with CMOS, NMOS, and bipolar/CMOS process flows.

While the invention has been particularly shown and described with reference to a preferred embodiment, it will be understood by those skilled in the art that various changes in form and detail may be made therein without departing from the spirit and scope of the invention.

I claim:

1. A local interconnect structure for an integrated circuit device, comprising:
   a substrate having a upper surface;
   a gate electrode on a portion of the substrate upper surface, the gate electrode having a conductive layer separated from the substrate upper surface by a gate oxide layer, and further having an insulating etch stop layer on the conductive layer, wherein the etch stop layer is formed from a material which resists etching by an etchant used to etch silicon oxide;
   insulating sidewall spacers alongside the gate electrode and resting on the substrate upper surface;
   highly doped source/drain regions within the substrate and laterally spaced from underneath the gate electrode;
   sloped filler spacers on the substrate upper surface against the insulating sidewall spacers, wherein the filler spacers have a generally convex upper surface;
   a conductive local interconnect in contact with a portion of a source/drain region, and extending over a sloped filler spacer and an insulating sidewall spacer to a location over a portion of the gate electrode.

2. The local interconnect structure of claim 1, wherein the gate electrode conductive layer comprises silicide.

3. The local interconnect structure of claim 1, wherein the insulating etch stop layer comprises:
   a lower oxide layer in contact with the gate electrode conducive layer; and
   an upper etch stop layer on the lower oxide layer.

4. The local interconnect structure of claim 1, wherein the conductive local interconnect comprises:
   a lower barrier metal layer; and
   an upper metal layer.

5. The local interconnect structure of claim 1, wherein the sloped filler spacers comprise a doped oxide having dopants at a level which cause the doped oxide material to flow at elevated temperatures.

6. The local interconnect structure of claim 3, wherein the upper etch stop layer comprises nitride.

7. The local interconnect structure of claim 4, wherein the upper metal layer comprises aluminum.

8. The local interconnect structure of claim 4, wherein the lower barrier metal layer comprises titanium-tungsten.

9. The local interconnect structure of claim 5, wherein the sloped filler spacers comprise BPSG.

10. The local interconnect structure of claim 5, wherein the sloped filler spacers comprise PSG.

* * * * *